United States Patent [19]

Rainal

[11] Patent Number: 4,498,122
[45] Date of Patent: Feb. 5, 1985

[54] HIGH-SPEED, HIGH PIN-OUT LSI CHIP PACKAGE

[75] Inventor: Attilio J. Rainal, Convent Station, N.J.

[73] Assignee: AT&T Bell Laboratories, Murray Hill, N.J.

[21] Appl. No.: 454,197

[22] Filed: Dec. 29, 1982

[51] Int. Cl.³ ............................................. H05K 1/14
[52] U.S. Cl. .................................. 361/414; 174/34; 174/36; 174/68.5
[58] Field of Search ............... 361/414; 333/238, 236; 174/68.5, 36, 34

[56] References Cited

U.S. PATENT DOCUMENTS

| | | | |
|---|---|---|---|
| 3,568,000 | 3/1971 | D'Aboville | 361/414 |
| 3,643,201 | 2/1972 | Harwood | 333/238 X |
| 3,740,678 | 6/1973 | Hill | 361/414 X |
| 3,867,759 | 2/1975 | Siefker | 361/414 X |
| 4,047,132 | 9/1977 | Krajewski | 361/414 |
| 4,353,040 | 10/1982 | Krumm et al. | 333/236 |

OTHER PUBLICATIONS

Helmut E. Brenner, Use a Computer to Design Suspended-Substrate ICs, Microwaves, Sep. 1968, pp. 38 to 43 relied on, copy in 333-238.

A. J. Rainal, Transmission Properties of Various Styles of Printed Wiring Boards, Bell System Tech. J., vol. 58 #5, Jun. 1979, pp. 995 to 1025.

*Primary Examiner*—R. R. Kucia
*Attorney, Agent, or Firm*—Stephen M. Gurey; Lester H. Birnbaum

[57] ABSTRACT

A high-speed, high pin-out chip carrier package (10) for interconnecting at least one LSI or VLSI chip to a circuit pack is disclosed. The package includes a ground plane (19), a power plane (20), and at least one signal layer (15, 16, 17, 18) containing plural conductors therethrough. Layers (85) of dielectric material separate adjacent conductive layers, (15, 16, 17, 18, 19, 20). By controlling, in design, the width of each signal conductor and its distance to the nearest ground (19) or power plane (20), the package is impedance-matched to the circuit pack. Plural plated-through holes (21) are disposed through the package for electrically interconnecting the signal conductors, the ground plane (19), and the power plane (20) to the circuit pack, and are arranged in a pattern to reduce inductive noise.

11 Claims, 3 Drawing Figures

HIGH-SPEED, HIGH PIN-OUT LSI CHIP PACKAGE

BACKGROUND OF THE INVENTION

This invention relates to chip packages which interconnect integrated circuit (IC) chips of the LSI or VLSI type to circuit packs and; more particularly, the invention relates to high-speed, high pin-out chip packages.

Various types of circuit packs are presently available. Each type or style of circuit pack, or printed wiring board, can be characterized by the particular arrangement and number of conductor layers. These layers include signal layers and separate ground and power planes, all of which are interspaced with layers of dielectric material. The transmission characteristics of these various types of circuit packs are detailed in an article by the present inventor and entitled "Transmission Properties of Various Styles of Printed Wiring Boards," *Bell System Technical Journal,* Vol. 58, No. 5, May–June 1979. As can be noted therein, various pulse transmission properties depend upon the type or style of circuit pack. For example, characteristic impedance is a function of intralayer conductor spacing, interlayer conductor spacing, and conductor width.

In order to attach an integrated circuit chip of the LSI or VLSI type to a circuit pack, the electrical contacts or wire bonds from the chip can be directly affixed to electrical contacts on the circuit pack. For purposes of repair and testing, however, direct mounting of the IC chip on the circuit pack is disadvantageous, since removal of the chip is difficult.

A preferable arrangement for mounting an IC chip to a circuit pack is to affix either one or plural chips onto a chip package which, in turn, is affixed to the circuit pack. Such a chip package can take the form of a mini-printed wiring board having a plurality of leads or pins, which attach to the circuit pack. Such mini-board chip packages can have a structure similar to one of the types described in the aforenoted article. The transmission properties of such a package therefore also depend on the type or style of the physical arrangement of the package. As the operating speed of an integrated circuit chip increases, the transmission properties of the chip package become an important consideration. In particular, inductive noise between the chip package and the printed wiring board limits the physical design of the chip packages. Such noise becomes a problem when the rise time of the pulse signals transmitted between the chip and printed wiring board is 5ns ($5 \times 10^{-9}$ sec) or less. Furthermore, as the number of pin-outs (signal, ground, and power leads) on a chip package increases, such signal distortion problems due to inductive noise are exacerbated as a result of decreased interconnector lead spacing and increased cross-talk.

The problem, then, is to design a high-speed, high pin-out chip package which has reduced inductive noise.

SUMMARY OF THE INVENTION

In accordance with the present invention, inductive noise is minimized on a high-speed, high pin-out chip carrier package, which is designed to be impedance-matched to a high performance multilayer circuit pack. High-speed refers to signal rise times faster than 5ns, and high pin-outs refers to pin-outs greater than 60. The chip package, adapted to receive at least one integrated circuit chip thereon includes at least one ground plane, at least one power plane, and at least one signal layer containing plural conductors therethrough. Layers of dielectric material separate adjacent conductive layers. The package is impedance-matched to the printed wiring board by controlling, in design, the width of each signal conductor and its distance to the nearest ground or power plane. Plural plated-through holes are disposed through the package for electrically interconnectng the signal conductors, the ground plane, and the power plane to the circuit pack, and are arranged in a predetermined pattern to reduce inductive noise. In particular, the power and ground plated-through holes are located substantially symmetrically on the package, and each signal plated-through hole is located proximate to a power or ground plated-through hole.

DETAILED DESCRIPTION

Figure 1:
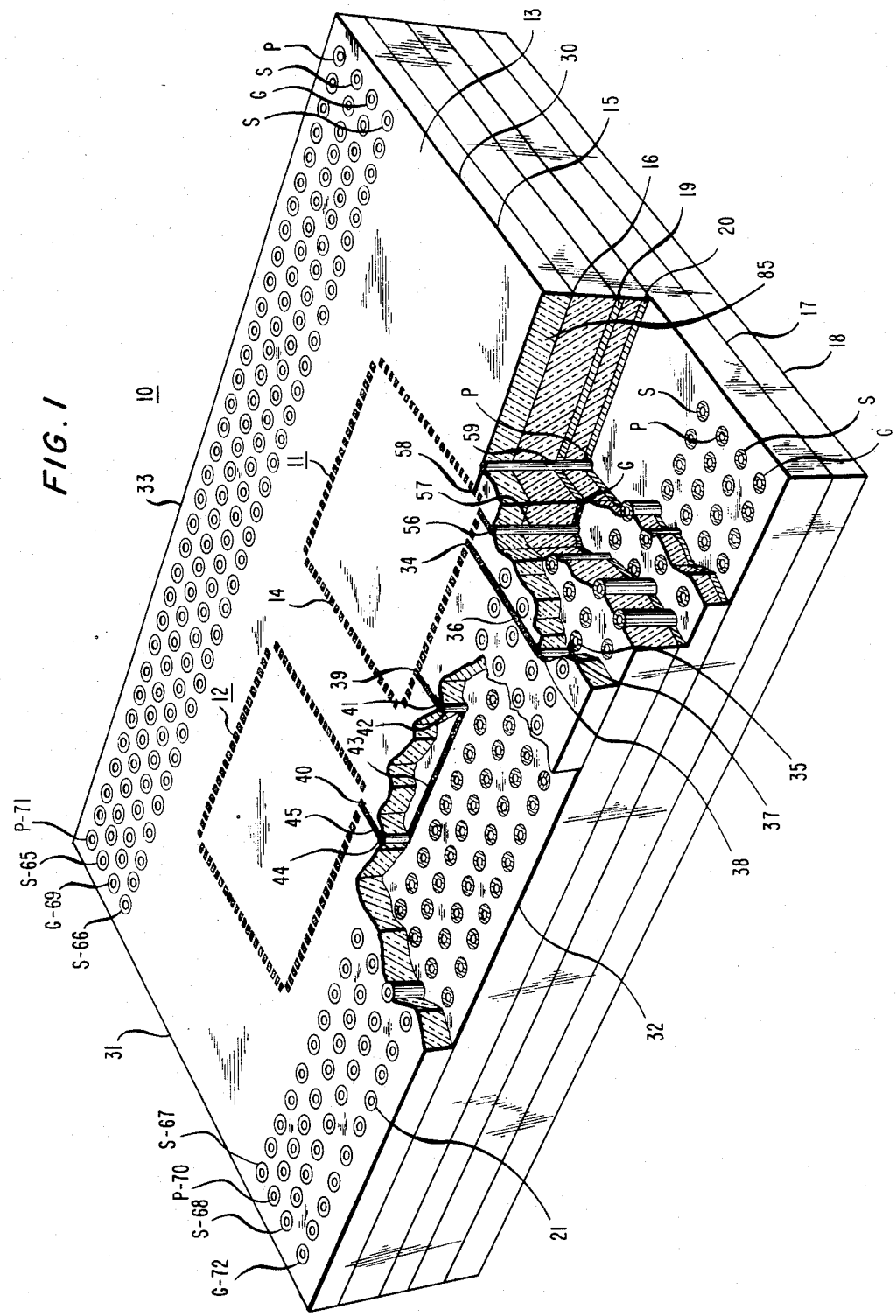
FIG. 1 is a chip carrier package in accordance with the present invention adapted to receive two integrated chips thereon.
Figure 2:
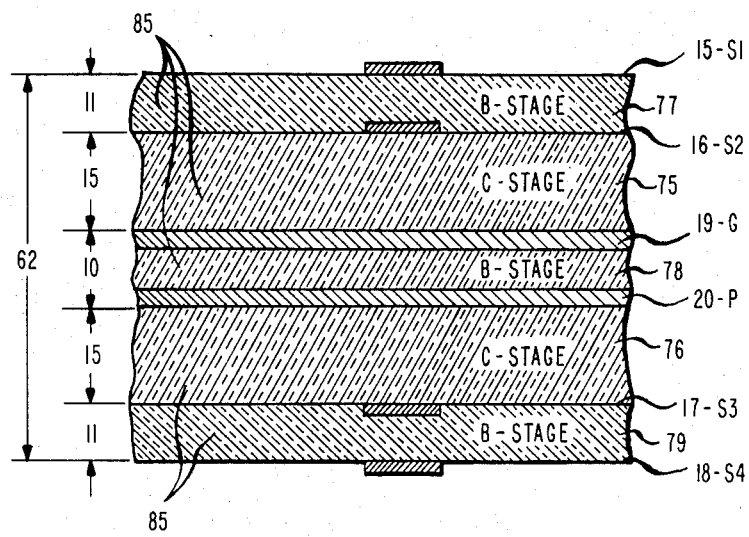
FIG. 2 is a structural representation of a six-layer multilayer board having interior power and ground planes, which has been used as the structural foundation for the chip carrier of FIG. 1.

With reference to FIG. 1, a six-layer chip package 10 is shown that is designed to interconnect two high-speed, high pin-out integrated circuit chips to a circuit pack. The chip package is equivalent in cross-sectional structural design to the six-layer multilayer printed wiring board with interior power and ground planes and surface routing that is illustrated on page 1023 of the aforenoted article by the present inventor and reproduced herein as FIG. 2. FIG. 2 is used in the description hereinafter as a generalization of cross-sectional structure of the chip package of FIG. 1.

With reference to FIGS. 1 and 2, the six-layer chip package 10 includes $S_1$ signal layer 15, $S_2$ signal layer 16, $S_3$ signal layer 17, $S_4$ signal layer 18, G ground plane 19, and P power plane 20. A layer 85 of epoxy glass dielectric material is disposed between signal layers 15 and 16, signal layer 16 and ground plane 19, ground and power planes 19 and 20, power plane 20 and signal layer 17, and signal layers 17 and 18. A protective polymer coating is disposed on $S_1$ signal layer 15 and $S_4$ signal layer 18.

Chip package 10 is adapted to have mounted thereupon two IC chips and to provide electrical interconnection of the signal, power, and ground inputs and outputs of the two chips to the circuit pack when chip package 10 is affixed thereto. In addition, chip package 10 provides direct electrical interconnection between the two chips, as required. Electrical interconnection between the chip and the circuit pack is effected by conductive paths disposed through the package 10 between the plural chip contacts 14 to which the input, output, power, and ground leads of the chip are affixed, and plated-through holes 21 disposed through the package. The signal input/outputs of the chips are connected by conductors in signal layers 15 through 18 to signal plated-through holes; the ground input/outputs of the chips are connected to the ground plane 19 to which all ground plated-through holes are connected;

and the power input leads of the chips are connected to power plane 20 to which all the power plated-through holes are connected. Package 10 is affixed to a circuit pack (not shown) by means of short conductive pins inserted in the plated-through holes 21 which are then attached to the circuit pack. Alternatively, the plated-through holes, or contacts, can be soldered directly to the circuit pack using, for example, solder balls.

With reference to FIG. 1, chip package 10 includes sets 11 and 12 of contacts 14 on top surface 13. The contacts 14 in each set 11 and 12 are arranged in a rectangular pattern to match the corresponding pattern of contacts or wire bond leads from the IC chip (not shown) that is to be affixed thereon. In the particular embodiment disclosed herein, contact sets 11 and 12 are each adapted to receive high pin-out IC chips that have 84 input/output/power/ground leads with 21 leads on each side.

Figure 3:
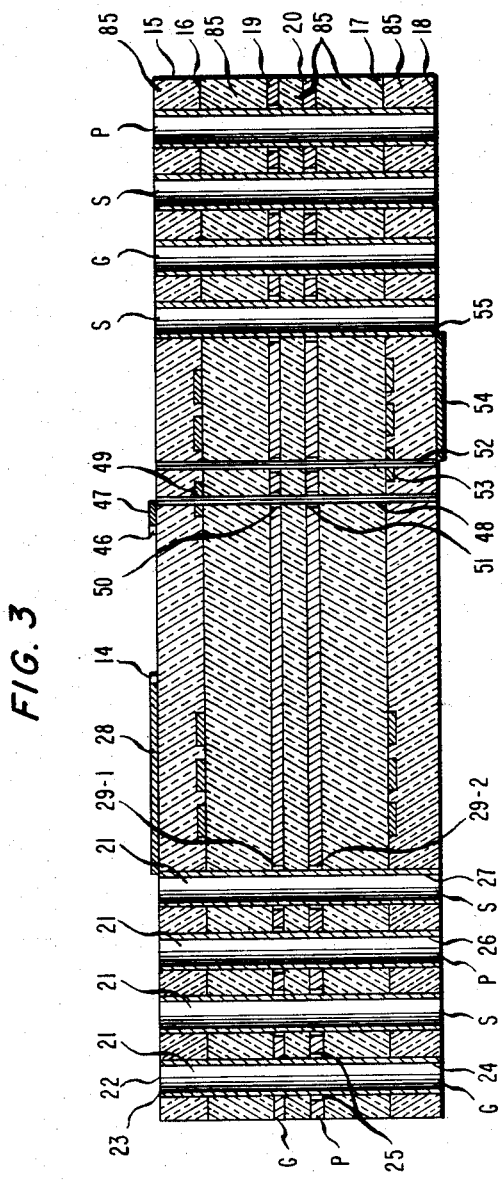
FIG. 3 is a cross-sectional view of the chip package of FIG. 1.

With reference to FIG. 1 and the cross-sectional view of chip package 10 in FIG. 3, each plated-through hole 21, as is standard in printed wiring board technology, includes an aperture 22, through the plural layers of the package 10, and an annular metallic region 23, disposed on the inside walls of the aperture 22. Each ground plated-through hole, such as, for example, plated-through hole 24 in FIG. 3, makes electrical contact with ground plane 19. A clearance hole 25 isolates the conductive path 23 of the plated-through hole 24 from the power plane 20. Similarly, each power plated-through hole, such as 26 in FIG. 3, makes electrical contact with power plane 20, and is isolated electrically from ground plane 19 by means of a clearance hole through that plane.

Each signal plated-through hole, such as 27 in FIG. 3, makes electrical contact with a conductor 28 which is connected to a signal contact 14 by means of conductor segments on one or plural signal layers 15, 16, 17, and 18. Clearance holes 29-1 and 29-2 through ground plane 19 and power plane 20, respectively, electrically isolate the signal plated-through holes from the ground and power planes.

As noted hereinabove, each signal plated-through hole is connected to a signal contact 14 by means of plural conductor segments which traverse at least one of the signal layers 15, 16, 17, and 18. In order to facilitate the routing of conductors on each signal layer and to prevent conductor cross-overs, conductors are routed on each signal layer in a single direction. Accordingly, the conductors in signal layers 15 and 18 run parallel to side edges 30 and 31; and the conductors in signal layers 16 and 17 run parallel to side edges 32 and 33. Therefore, the conductive path between each signal contact 14 and signal plated-through hole 21 generally consists of plural conductor segments on plural signal layers, interconnected by means of what are commonly known in the printed wiring board art as vias. Each via provides an electrical path perpendicular to surface 13 between conductor segments on different signal layers.

To preserve the clarity of the drawings, only a selected few of the actual plural connections between contacts 14 and the signal plated-through holes, ground plane 19, and power plane 20 are shown in FIGS. 1 and 3. With reference to FIG. 1, and by way of illustration, contact 34 is connected to signal layer 15, conductor segment 37 on signal layer 16, and via 38, which interconnects segments 36 and 37. Similarly, the electrical path between contact 39 in contact set 11 and contact 40 in contact set 12 includes conductor segment 41 on layer 15, conductor segment 43 on layer 16, and conductor segment 45 on layer 15. Via 42 interconnects segments 41 and 42, and via 44 interconnects segments 43 and 45.

As further illustration, with reference to FIG. 3, contact 46 is connected to conductor segment 47 on layer 15. Via 48 connects conductor segment 47 to conductor segment 49 on layer 16, conductor 49 being disposed perpendicularly to the plane of the cross-sectional cut of FIG. 3. Clearance holes 50 and 51 on ground plane 19 and power plane 20, respectively, isolate via 48 from these conductive planes. As another illustrative example, via 52 interrconnects conductor 53 on layer 17 and conductor 54 on layer 18, the latter being connected to signal plated-through hole 55.

With reference again to FIG. 1, the ground and power contacts 14 are connected directly by vias to the ground layer 19 and power layer 20, respectively. For example, ground contact 56 is connected by via 57 to ground plane 19, and power contact 58 is connected to power plane 20 by via 59.

The discussion hereinabove focused on only a few illustrative connections between contacts 14 and plated-through holes 21. It is readily appreciated by one skilled in the art that for each contact 14 on sets 11, there will be a connection to either another contact on the other set or a connection to a plated-through hole 21, either directly through conductor segments on the signal layers 15 through 18, or through the ground plane 19 or power plane 20.

As heretofore discussed, as the operating speed of an IC chip increases, and the number of pin-outs on a chip package increases, it is critical that the chip package be designed for reduced inductive noise. In accordance with the present invention, inductive noise is minimized in chip package 10 by a two-fold design process: the chip package 10 is designed to be impedance-matched to the circuit pack to which it is to be attached; and the plated-through holes 21 are distributed on the package 10 in accordance with a predetermined set of design rules.

By designing chip package 10 to be impedance-matched to the circuit pack to which it is to be attached, undesirable signal reflections between the circuit pack and the package are minimized, thereby eliminating and/or minimizing signal distortions due to ringing, overshoot, and undershoot. As described in the aforenoted article on printed wiring boards by the present inventor, each style of printed wiring board or circuit pack has a characteristic impedance which is a function of several factors. The chip package 10 of the present invention is impedance-matched, within tolerances, to the characteristic impedance of the particular circuit pack to which it is to be attached by controlling in design the impedance of the conductors in each signal layer 15, 16, 17, and 18. The impedance of the signal conductors is controlled in design by varying the two design parameters of the signal conductors that determine impedance: the width of the conductor, and the distance between the conductor and the nearest constant potential plane (i.e., ground and power planes 19 and 20).

Using embedded microstrip transmission line theory, the impedance of a conductor embedded within a dielectric and disposed over a constant potential plane, can be derived. The relationship between impedance Z and the width w of a conductor disposed a distance h over a constant potential plane when embedded within epoxy glass having a dielectric coefficient $\epsilon_R$ of 4.2 has been derived from mathematical and experimental results to be:

$$Z = 25 \ln(8h/w). \quad (1)$$

The general equation for a conductor embedded in a dielectric having a coefficient $\epsilon_R$ is given by:

$$Z = 25 \sqrt{4.2/\epsilon_R} \ln\left(\frac{8h}{w}\right). \quad (2)$$

From equations (1) and (2), it is apparent that the ratio of h to w must be substantially the same for all conductors in each signal layer for the impedance of the conductors in all layers to be substantially the same. Therefore, for best impedance match, the width w of the conductors in signal layers 15 and 18, which are further away from constant potential planes 19 and 20, respectively, is greater than the width of the conductors in the signal layers 16 and 17. Using the illustrative numerical parameters of layer thicknesses in FIG. 2, it is readily shown that, for best impedance match, $$w_{S1} = 1.73 w_{S2}; \text{ and} \quad (3)$$

$$w_{S4} = 1.73 w_{S3}. \quad (4)$$

In order to reduce inductive noise between the chip package 10 and the circuit pack to which it is to be attached, the signal, ground, and power plated-through holes are disposed throughout the package in a physical arrangement that satisfies two general rules that have been developed mathematically and experimentally to yield minimum inductive noise. These rules are: the ground plated-through holes and the power plated-through holes are separated from one another and located symmetrically on the chip package; and the signal plated-through holes are located as near as possible to the power and ground plated-through holes.

Application of these rules to chip package 10 is demonstrated by referring again to FIG. 1. The signal S plated-through holes are uniformly spaced in rows 65, 66, 67, and 68 parallel to side edges 32 and 33. A row 69 of ground G plated-through holes separates signal rows 65 and 66, and a row 70 of power P plated-through holes separates rows 67 and 68. A row 71 of power plated-through holes is disposed between signal row 65 and edge 33, and a row 72 of ground plated-through holes is disposed between signal row 68 and edge 32. The power and ground plated-through holes are separated and located symmetrically, i.e., if all power plated-through holes are made ground plated-through holes, and all ground plated-through holes are made power plated-through holes, the resultant arrangement of plated-through holes on package 10 remains electrically equivalent. Also, the signal plated-through holes are located adjacent to power and ground plated-through holes. This arrangement, therefore, satisfies the aforenoted rules for reducing inductive noise. It is understood that such an arrangement is not unique, and other arrangements of signal, power, and ground plated-through holes will also satisfy the above-noted rules to reduce inductive noise.

As aforenoted, each signal plated-through hole is connected by a series of conductor segments on signal layers 15 through 18 to a signal contact 14 in either contact set 11 or 12. The ground plated-through holes are connected directly to ground plane 19, and the power plated-through holes are connectd directly to power plane 20. While, generally, there is a one-to-one correspondence between signal plated-through holes and signal contact regions 14 (except for those interconnected signal contacts between sets 11 and 12, viz contacts 39 and 40), there are more ground and power plated-through holes than ground and power contact regions 14. These additional ground and power plated-through holes are disposed in package 10 in order to satisfy the above-noted rules for reducing inductive noise.

Chip package 10 is fabricated using standard printed wiring board manufacturing technology. With reference to FIG. 2, chip package 10 includes C-stages 75 and 76, and B-stages 77, 78, and 79. As is well known in the printed wiring board art, C-stage material is comprised of three bonded layers: copper, dielectric, and copper. B-stage material is comprised of a single dielectric layer. In the embodiment disclosed herein, the dielectric layers in B- and C-stages 75 through 79 is epoxy glass.

C-stage 75 includes $S_2$ signal layer 16 on its first planar side, and ground plane 19 on the second side. Similarly, C-stage 76 includes power plane 20 on its first planar side, and $S_3$ signal layer 17 on the second side. Using the artwork prepared for each signal layer and power and ground planes, signal layer 16 and ground plane 19 are photo-defined on C-stage 75. Similarly, signal layer 17 and power plane 70 are photo-defined on C-stage 76. The location of the conductors, vias, plated-through holes, and clearance holes are thereby established on these layers. The relationship between the width of the conductors and the distance between the conductors and the constant potential planes is determined in accordance with equation (1) to impedance-match the conductors on signal layers 16 and 17 to the impedance of the circuit pack to which chip package 10 is to be attached. C-stages 75 and 76 are then photo-etched to create the individual conductor segments. B-stage 78 is disposed between stages 75 and 76, the thickness of this stage being selected to be as small as possible to minimize the inductance path. B-stage 77 is disposed on C-stage 75, and B-stage 79 is disposed under C-stage 76; and the five stages are laminated together to form a unitary structure. Using foil technology, $S_1$ signal layer 15 is disposed on B-stage 77; and $S_4$ signal layer 18 is disposed on B-stage 79. The vias, plated-through holes, and clearance holes are then drilled and filled with copper, using electroless and electrolytic plating. Signal layers 15 and 18 are photo-defined, and then etched, the widths of the conductors formed thereon being determined by equation (1). A protective polymer cover coating is then disposed over $S_1$ signal layer 15 and $S_4$ signal layer 18.

The chip package of the present invention has several advantageous properties: (1) Plated-through holes can be arranged to satisfy routing constraints of the circuit pack to which the package is to be attached, as long as the arrangement satisfies the afore-described rules. (2) The chip package has minimum power and ground lead inductance, because the leads from the chip contacts to the circuit pack are as short as possible. (3) The chip package yields minimum cross-talk, because the signal leads from the chip contacts to the circuit pack have minimum coupled lengths. (4) As aforenoted, the chip package can be mounted on a circuit pack by either plated-through holes or surface mounting. (5) The chip package can be matched to a circuit pack, irrespective of the number of pin-outs. (6) The chip package can contain single or multiple chips.

Other embodiments of the present invention may contain fewer or more signal layers than the embodiment described in detail herein. Also, other embodiments may contain more than one ground and/or power plane.

The above-described embodiment is illustrative of the principles and applications of the present invention. Other embodiments may be devised by those skilled in the art without departing from the spirit and scope of the present invention.

What is claimed is:

1. A multilayer, high-speed, high pin-out integrated circuit chip package comprising
    plural dielectric layers,
    plural signal, ground, and power contacts in contact with at least one of said dielectric layers and arranged for connection to at least one integrated circuit chip,
    at least one constant potential ground plane in contact with at least one of said dielectric layers,
    at least one constant potential power plane in contact with at least one of said dielectric layers,
    at least one signal layer in contact with at least one of said dielectric layers and having plural conductors therethrough, each of said plural conductors having predetermined physical parameters so that the characteristic impedance of said chip package is substantially equal to a predetermined value,
    means connecting said ground contacts to said ground plane and means connecting said power contacts to said power plane,
    plural signal, ground, and power plated-through holes extending completely through said plural dielectric layers, said constant potential planes and said at least one signal layer, said conductors interconnecting said signal contacts and signal plated-through holes, said ground plated-through holes being connected to said ground plane, and said power plated-through holes being connected to said power plane,
    said plated-through holes being adapted for electrical attachment to a circuit pack, and
    said power and ground plated-through holes being located substantially symmetrically, and each of said signal plated-through holes being located proximate to a power or ground plated-through hole.

2. A chip package in accordance with claim 1 wherein for each of said conductors the ratio of the width of the conductor to its distance to the nearest one of said constant potential planes is substantially equal to a predetermined constant.

3. A chip package in accordance with claim 1 wherein said chip package comprises plural signal layers, each of said layers having plural conductors therethrough, and the physical properties of each of said conductors in said package are such that the impedance of each of said conductors is substantially proportional to $$\sqrt{\frac{1}{\epsilon_r}} \ln\left(\frac{8h}{w}\right)$$

where $\epsilon_r$ is the dielectric coefficient of said dielectric layers, h is the distance between the conductor and the nearest of one of said constant potential planes, and w is the width of the conductor.

4. A chip package in accordance with claim 2 wherein each of said signal plated-through holes is adjacent to a power or ground plated-through hole.

5. A multilayer, high-speed, high pin-out integrated circuit chip package comprising
    plural dielectric layers,
    a constant potential ground plane,
    a constant potential power plane,
    at least one signal layer having plural conductors therethrough,
    characterized in that
    each of said conductors has predetermined physical parameters so that the characteristic impedance of said chip package is substantially equal to a predetermined value,
    plural signal, ground, and power plated-through holes are disposed entirely through said plural dielectric layers, said ground and power planes, and said at least one signal layer,
    said plated-through holes are adapted for electrical attachment to a circuit pack, and
    each of said power and ground plated-through holes is located substantially symmetrically, and each of said signal plated-through holes is located proximate to a power or ground plated-through hole.

6. A chip package in accordance with claim 5 further characterized in that
    for each of said conductors, the ratio of the width of each of said conductors to its distance to the nearest one of said constant potential planes is substantially equal to a predetermined constant.

7. A chip package in accordance with claim 5 wherein said chip package comprises plural signal layers, each of said signal layers having plural conductors therethrough, and said package is
    further characterized in that
    the physical properties of each of said conductors in said package are such that the impedance of each of said conductors is substantially proportional to $$\sqrt{\frac{1}{\epsilon_r}} \ln\left(\frac{8h}{w}\right)$$

where $\epsilon_r$ is the dielectric coefficient of said dielectric layers, h is the distance between each conductor and the nearest one of said constant potential planes, and w is the width of the conductor.

8. A chip package in accordance with claim 5 further characterized in that
    each of said signal plated-through holes is adjacent to a power or ground plated-through hole.

9. A multilayer, high-speed, high pin-out integrated circuit chip package comprising
    an integrated circuit chip having plural signal, power, and ground lead,
    plural dielectric layers, a constant potential ground plane in contact with at least one of said dielectric layers, a constant potential power plane in contact with at least one of said dielectric layers, at least one signal layer in contact with at least one of said dielectric layers and having plural conductors therethrough, each of said plural conductors having predetermined physical parameters so that the characteristic impedance of said chip package is substantially equal to a predetermined value, ground connecting means for connecting said ground leads to said ground plane, power connecting means for connecting said power leads to said power plane, signal connecting means for connecting said signal leads to said conductors, plural signal, power, and ground plated-through holes extending entirely through said plural dielectric layers, said constant potential planes and said at least one said signal layer, said ground plated-through holes being connected to said ground plane, said power plated-through holes being connected to said power plane, and said conductors interconnecting said signal plated-through holes and said signal connecting means, said plated-through holes being adapted for electrical attachment to a circuit pack, and said power and ground plated-through holes being located symmetrically, and each of said signal plated-through holes being located proximate to a power or ground plated-through hole so as to minimize inductive noise between the chip package and circuit pack.

10. A chip package in accordance with claim 9 wherein for each of said conductors, the ratio of the width of the conductor to the nearest one of said constant potential planes is substantially equal to a predetermined constant.

11. A chip package in accordance with claim 10 wherein each of said signal plated-through holes is adjacent to a power or ground plated-through hole.

* * * * *

UNITED STATES PATENT AND TRADEMARK OFFICE
CERTIFICATE OF CORRECTION

PATENT NO. : 4,498,122

DATED : February 5, 1985

INVENTOR(S) : Attilio J. Rainal

It is certified that error appears in the above-identified patent and that said Letters Patent is hereby corrected as shown below:

Column 3, line 64, "signal layer" should read --signal. plated-through hole 35 by means of conductor segment 36 on signal layer--. Column 6, line 2, "connectd" should read --connected--. Column 8, line 67, "lead" should read --leads--.

Signed and Sealed this

Twenty-fourth Day of September 1985

[SEAL]

Attest:

Attesting Officer

DONALD J. QUIGG

Commissioner of Patents and
Trademarks—Designate